United States Patent [19]

Herzer et al.

[11] 4,140,571
[45] Feb. 20, 1979

[54] CRUCIBLE-FREE ZONE REFINING OF SEMICONDUCTOR MATERIAL INCLUDING ANNULAR SUPPORT MEMBER

[75] Inventors: Heinz Herzer; Helmut Zauhar, both of Burghausen; Eberhard Mücke, Mehring-Öd; Franz Köhl, Burghausen, all of Fed. Rep. of Germany

[73] Assignee: Wacker-Chemitronic Gesellschaft für Elektronik-Grundstoffe mbH, Burghausen, Fed. Rep. of Germany

[21] Appl. No.: 840,887

[22] Filed: Oct. 11, 1977

[30] Foreign Application Priority Data

Nov. 16, 1976 [DE] Fed. Rep. of Germany ....... 2652199

[51] Int. Cl.² ............................................. B01J 17/10
[52] U.S. Cl. .......................... 156/620; 156/DIG. 98; 422/250
[58] Field of Search ....................... 23/273 SP, 273 Z; 156/620, DIG. 98

[56] References Cited

U.S. PATENT DOCUMENTS

| 3,234,009 | 2/1966 | Siebertz | 156/620 |
| 3,403,007 | 9/1968 | Drangel | 156/620 |
| 3,923,468 | 12/1975 | Keller | 156/620 |
| 3,972,684 | 8/1976 | Defosse | 156/620 |

FOREIGN PATENT DOCUMENTS

1519901  2/1970  Fed. Rep. of Germany ........... 156/620

Primary Examiner—Stephen J. Emery
Attorney, Agent, or Firm—Allison C. Collard; Thomas M. Galgano

[57] ABSTRACT

A process for the crucible-free zone pulling of a polycrystalline rod held vertically, together with a seed crystal fixed at its lower end, in which a melting zone is produced by means of an induction heating coil surrounding the rod, which zone, by means of relative movement of the coil and rod, traverses the entire length of the rod starting from the seed crystal, characterized in that after attaching the seed crystal to the rod, a support member is moved, below the induction heating coil, towards the rod, which support member rests gently against the rod and after being positioned, solidifies to form a firm support for the rod. A device for carrying out the process is also included.

5 Claims, 4 Drawing Figures

CRUCIBLE-FREE ZONE REFINING OF SEMICONDUCTOR MATERIAL INCLUDING ANNULAR SUPPORT MEMBER

This invention relates to a process for the crucible-free zone pulling of a monocrystalline rod held vertically, together with a seed crystal fixed at its lower end, in which a melting zone is produced by means of an induction heating coil surrounding the rod, which zone, by means of relative movement of the coil and rod, traverse the entire length of the rod starting from the seed crystal. The invention also relates to a device for carrying out the process.

In recent years, the zone pulling of semiconductor rods, especially silicon rods, has undergone rapid development and, as a result of a great many improvements in pulling technology, monocrystals having particularly large diameters can now be produced. Such monocrystals could previously be made only by the Czochralski crucible pulling process. In this last-mentioned process, the crystal, hanging from a seed crystal, is pulled from the melt.

In the further processing of semiconductor material to form semiconductor components, faults in the crystal structure, such as dislocations, for example, have an especially adverse effect, as they reduce, in particular, the life of the minority carriers.

A common method of pulling dislocation-free semiconductors, involves, in both processes, narrowing the cross-section of the semiconductor rod with the seed crystal in the immediate vicinity of the point where the semiconductor rod is melted. This is achieved in that, after the attachment of the seed crystal to the molten portion or to a molten narrow section of the polycrystalline rod, the growth process proceeds smoothly as the seed crystal rotates, as a result of which, in the transition region between the seed crystal and the tapered portion of the rod, an elongated thin neck appears. This constriction between the seed crystal and the semiconductor rod prevents dislocations from spreading from the seed crystal into the semiconductor rod.

Whereas in the crucible pulling process, relatively heavy rods may be hung on this thin neck with no difficulty, the zone pulling process is decisively impaired because the rod rotates on the thin neck as its weight increases. When a certain length or rod has been exceeded, the occurrence of a slight assymmetrical force or imbalance is sufficient to cause the rod to start swinging in pendulum fashion; a build-up of the high frequency power is associated with this and the pulling process must consequently be immediately stopped.

From German Offenlegungsschrift No. 15 19 901 it is known to provide the vertical coaxial mounting for the end of the rod that is provided with the seed crystal, with a sleeve, which may be displaced axially relative to the mounting. On the rim of the sleeve facing the semiconductor rod there are at least three supports spaced at the same angular distance from one another. These rigidly-attached supports hold the semiconductor rod in the tapered transition region, but as this latter region does not normally grow uniformly in the ideal manner, a uniform exertion of pressure is not thereby ensured.

German Offenlegungsschrift No. 24 55 173 describes a support mechanism which involves folding up concentrically about the seed crystal a multisectional funnel-shaped sleeve, the upper rim of which reaches beyond the tapered transition region between the seed crystal and the semiconductor rod and which is filled with sand or metal balls. According to this method, the system may be stabilized to a certain extent but relatively large vibrations of the rod cannot effectively be stopped by the flexible support system.

Finally, U.S. Pat. No. 3,972,684 discloses a process according to which several rod-like supports are moved hydraulically from below towards the tapered transition region between the seed crystal and the semiconductor rod. The upper portion of these supports consists of a compressible material so that even when the tapered transition region is asymmetric, which is usually the case, as far as possible, every rod-shaped support is brought into contact with the semiconductor rod. But even according to this process, a uniform application of pressure, which is important for the functioning of the support effect when the rods are relatively long, or when the weights of the rods are great, is not achieved.

It is, therefore, the object of the invention to find a process according to which during the pulling process, a support is so moved towards the rod that the highly sensitive growth process is not disturbed and, as the growth process progresses and as the weight of the rod thus increases, the growing rod is supported as firmly and rigidly as possible.

This problem is solved in accordance with the present invention by a process which is characterized in that, after attaching the seed crystal to the rod, a support member is moved, below the induction heating coil, towards the rod, which support member rests gently against the rod and after being positioned, solidifies to form a firm support for the rod.

Such support members may, for example, consist of plastic material, especially of epoxy resins, i.e. pressure-setting plastics, which are formed as condensation products from epoxides or the intermediates thereof, such as epichlorohydrin or dichloropropanol with polyols, glycidyl esters or cyanuric acid. Preferred epoxy resins are those resins known under the name of Araldite, which are produced by reacting epichlorohydrin with phenols, alcohols, carboxylic acid, cyclic ureas or triatines.

Such support members made of epoxy resins have to be freshly produced every time from the individual components before use. If these support members are moved towards the tapered transition region between the seed crystal and the semiconductor rod, when this still has a temperature of about 100 to 300° C., then they soften superficially, as a result of which they can be placed against the rod without difficulty, and then cure very rapidly to form an inflexible joint which is extremely rigid and thus has a correspondingly good support effect.

In addition to support members made of plastic material, which have to be freshly prepared before use, since the curing process must not be completed if the support members are to have the properties required according to the invention, preference is given to the use of support members made of glass. These vitreous support members are moved towards the intended point on the semiconductor rod, preferably in the tapered transition region to the seed crystal, when this point still has a temperature sufficient to cause the vitreous support member to soften on the side facing this point of the rod, so that the support members rests gently against the rod. As this point of the rod cools progressively, owing to the fact that the molten zone moves upwards with the induction heating coil, the support member solidifies into a firm, inelastic support for the rod.

Glasses having a relatively high softening point, i.e., those types of glass which become viscous within a temperature range of about 600 to 900° C., are especially suitable for the crucible-free zone pulling of silicon rods. When these types of glass are used, the rod can be supported at a very early stage in the process; that is to say, almost immediately after the formation of the taper, or after the polycrystalline rod has been attached to the seed crystal.

When selecting suitable types of glass, it should be born-in-mind that glass generally becomes more difficult to melt by increasing the content of quartz and decreasing the basic constituents, such as, for instance, sodium, potassium or calcium oxides. Glasses that soften between temperatures of 600 and 900° C. and that are especially suitable are, for instance, sodium, potassium or calcium oxides. Glasses that soften between temperatures of 600 and 900° C. and that are especially suitable are, for example, aluminium silicate glasses and boron silicate glasses, which may be readily obtained under the trademark of Duran, Solidex or Pyrex. Because they are very hard-wearing and insensitive to rapid heating or cooling, they are widely used as glass for laboratory equipment.

Glasses having a high proportion of aluminium oxide (about 20 to 26% by weight) and a high proportion of boron oxide (about 7 to 10% by weight), which are known as Supremax glasses, and glasses having a proportion of quartz of more than 90% by weight, such as Vycor glass, are suitable for higher temperatures, i.e., for example, for temperatures between 900 and 1,200° C.

All the glasses mentioned have the advantage that they wet silicon well and when they are cooled subsequently do not crack or break but remain intimately joined to the silicon and, after cooling, form a firm, inelastic support.

Support members made of such glasses need not be manufactured immediately before their use, but may be conveniently kept in store.

In general, support members may be used in a great variety of forms, for example in the form of one or more rods, in the form of a funnel or, preferably, in the form of a ring having, for example, a circular, square or rectangular cross-section.

The support member may be moved by a suitable device, from the side or from below, towards the desired support point on the rod. It may be moved towards the solidified portion of the rod, for example, by a screwing movement, or preferably hydraulically or hydro-pneumatically.

A suitable mechanism for moving the support member towards the rod consists, for example, in that in the circular area of the drive shaft which, at its center has a central mounting for the seed crystal, support rods are mounted and are sealed off in a vacuum-tight manner in guide sleeves; the support rods may be moved vertically by hydraulic means and carry the support member at their upper end.

The exertion of pressure on the non-compressible liquid which flows by way of a rotating feed pipe into the hydraulic cylinders that are located, for example, at the lower end of the drive shaft, is effected using a pneumatic ram, or, preferably, directly effected by means of compressed air.

Other objects and features of the present invention will become apparent from the following detailed description considered in connection with the accompanying drawing which discloses the embodiments of the invention. It is to be understood, however, that the drawing is designed for the purpose of illustration only and not as a definition of the limits of the invention.

In the drawing, wherein similar reference characters denote similar elements throughout the several views.

Figure 1:
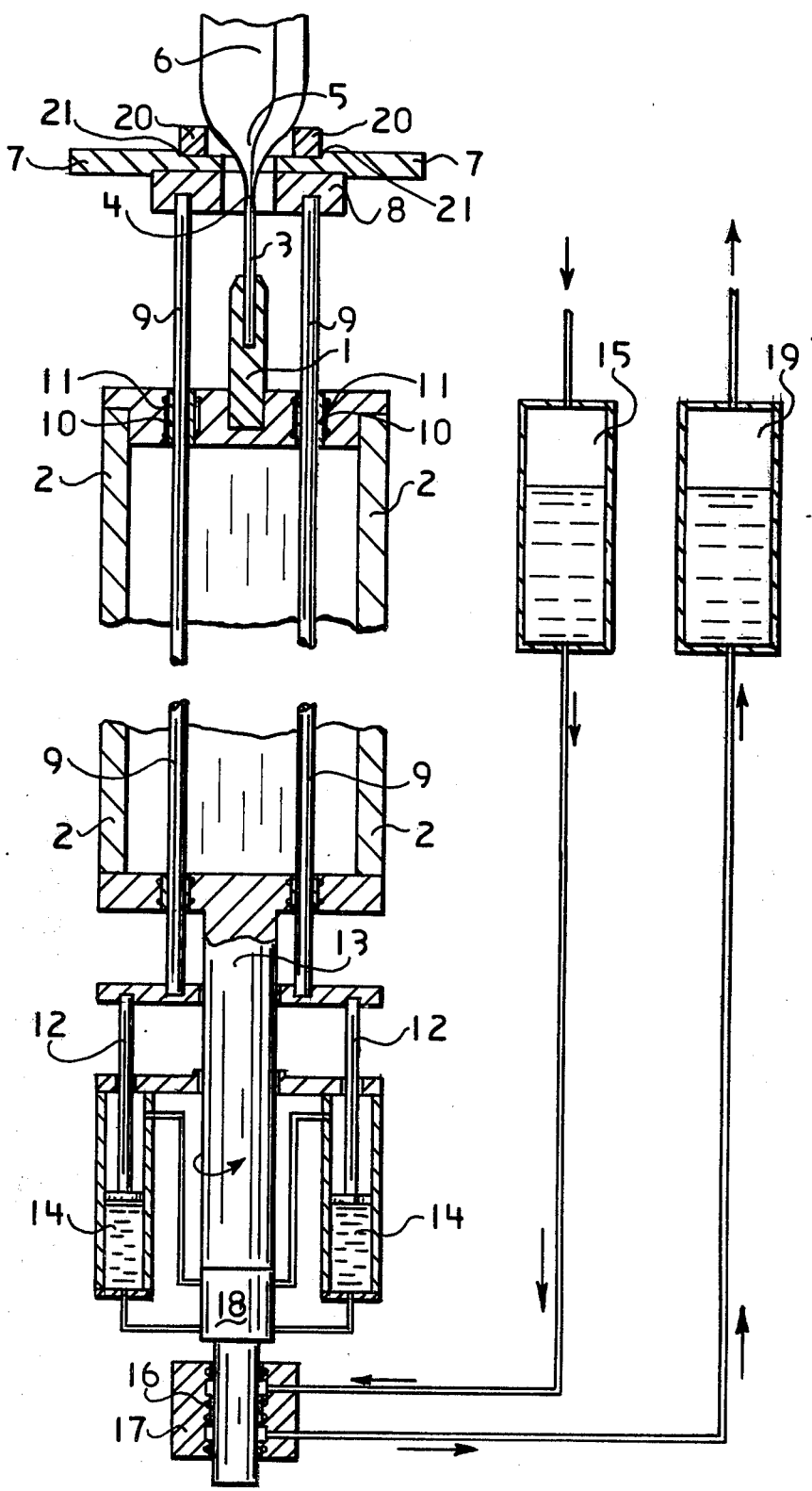
FIG. 1 shows schematically a device embodying the present invention for moving the support member towards the support point in the tapered transition region between the seed crystal and the rod.

Referring now to FIG. 1, at the beginning of the pulling process, a polycrystalline rod is attached in the usual manner to the seed crystal 3 located in the mounting 1 of the upper portion 2 designed as a hollow shaft, of the lower pulling shaft. When the seed crystal 3 has been brought into contact with the end of the polycrystalline supply rod, which end has been melted by means of an induction heating coil, in accordance with the process developed by W. C. Dash, the so-called bottleneck 4 is produced by rapidly pulling apart the polycrystalline rod and the seed crystal. After thickening again above the tapered intermediate region 5, the monocrystal 6 continues to grow with a uniform diameter and without dislocations.

While the tapered intermediate region 5 still has, for example in the case of silicon, a temperature of from 600 to 900° C., a rotating disc 7 provided at its center with an opening for the seed crystal 3 and lying on another steel ring 8, is moved upwards. This upward movement is effected, for example, by way of three steel rods 9 (only two of which are shown) which are set in the steel ring 8. These steel rods are the same angular distance apart, are guided in a vacuum-tight manner within the circular area of the upper portion 2, designed as a hollow shaft, of the pulling shaft, in guide sleeves 10 having suitable seals 11, and are pushed upwards by the rams 12 of the three co-rotating hydraulic cylinders 14 (only two being shown) on the shaft extension 13 of the pulling shaft. The supply of oil is effected in the case of the controlled upward movement, for example, by filling the oil-supply container 15 with compressed air by way of a suitable pneumatic control mechanism, so that oil is forced out of this container 15 into the rigid rotating feed pipe 17 which is located at the lowermost end of the pulling shaft and is provided with suitable seals 16. In the pulling shaft, the oil rises up into the oil-distributor 18 which is a part of the pulling shaft, and consequently rotates in accordance with the rotation of the pulling shaft. At this point, it is evenly distributed to the three co-rotating hydraulic cylinders 14, and thus a pressure is exerted on the ram 12. Because of the upward movement of the ram 12 occasioned thereby, in the upper portion of the hydraulic cylinders 14, the oil is recycled by way of the oil supply container 19. If the rotating disc 7, on which the support member 20 lies, is moved back, the oil supply container 19 is accordingly filled with compressed air so that the oil flow in the system is reversed.

Because of this preferred use of a hydro-pneumatic mechanism for movement, the supporting force of the support member 20 is effective entirely uniformly in an upward direction, and the motion of the rods 9 bearing the rotating disc 7 is entirely synchronous, smooth and resilient.

The actual support member 20 is preferably a vitreous, cylindrical piece of pipe, the inner diameter of which is smaller than the outer diameter of the semiconductor rod, but larger than the outer diameter of the seed crystal. Its wall thickness is about 10 to 30% of the outer diameter of the semiconductor rod whereas its height is entirely unimportant and, in the case of the preferred device, as illustrated in FIG. 1, is for example, one-tenth to one-third of the outer diameter of the semiconductor rod. This annular support member 20 is either secured concentrically on the steel disc 7 which is disposed at the upper end of the support rods 9 and is provided with a central opening for the passage of the seed crystal mounting 1, or it is preferably arranged so that it floats, that is, it is arranged unsecured and in the center. In the case of the second, preferred manner, in which the support member is arranged so that it floats, an annular groove 21, the outer diameter of which is about 5 to 10% larger than that of the annular support member 20, ensures that the annular support member 20 cannot slip too far away from the center. The unfixed, floating bearing surface of the support member 20 has the advantage that energy produced by vibration of the monocrystalline rod 6 after the support member 20 has been secured to the tapered transition region 5 of the monocrystalline rod 6, is converted into frictional energy of the support member 20 by frictional sliding engagement against the steel disc 7 and is in this manner effectively nullified. In addition, the steel disc 7 has the function of catching melt which may possibly drip down from the rod 6.

Figure 2:
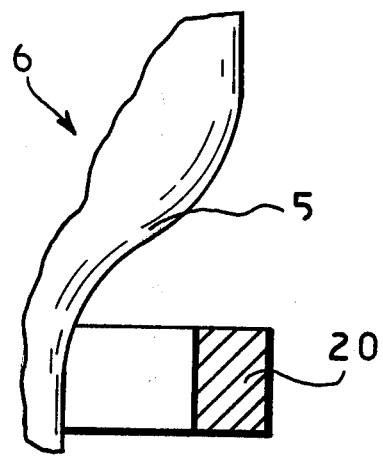
FIGS. 2-4 show in sequential stages the procedure for attaching a vitreous annular support member to the rod in accordance with the present invention.
Figure 3:
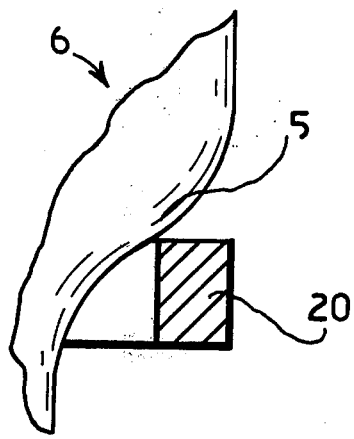
Figure 4:
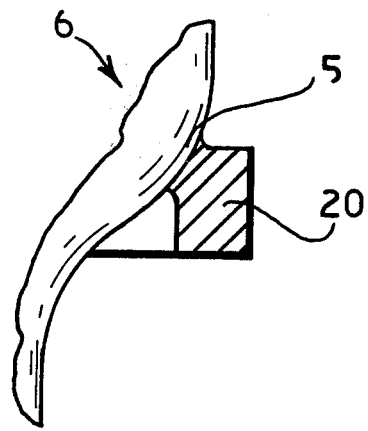

The support member 20 is fixed to the rod 6 by moving the annular, vitreous support member 20 in stages towards the tapered transition region 5, of the rod 6, which is still, for example, "red-hot". In the position shown in FIG. 2, the vitreous support member 20 is still far enough away from the "red-hot", tapered transition region 5 for its external shape to remain unaltered. The support member is then moved smoothly upwards into the position shown in FIG. 3 and held there, so that the parts of the vitreous support member 20 near to the hot surface of the tapered transition region 5 of the rod 6 become soft and viscous. The support member 20 is then again moved slowly upwards until a wetting, shown in FIG. 4, occurs and the support member 20 rests gently against the tapered transition region 5 of the rod 6.

The zone-melting process is continued during this latter procedure without interruption, so that the tapered transition region 5 cools down as a result of the molten zone moving away, and with the solidification of the vitreous support member 20 caused thereby the desired stabilizing supporting action becomes effective. The pressure which is transferred from the rams 12 by way of the support rods 9 to the support member 20 is then so adjusted that during the entire pulling process the support member 20 exerts a force of preferably from 50 to 100kgf on the rod 6. The upper limit of the force which may be exerted on the rod 6 is in general determined by the tear resistance of the narrowest point of the bottle-shaped transition 4 between seed crystal 3 and taper 5.

The crucible-free zone pulling of crystals of any kind can therefore be extended owing to the present invention, to practically unlimited lengths and weights of rod, as the intensity of the wetting and the supported rod area respectively can be readily adapted to particular requirements by suitable shaping of, and selection of, material for the support members which may be used according to the invention.

While only one embodiment of the present invention has been shown and described, it will be obvious to those skilled in the art that many changes and modifications may be made thereunto without departing from the spirit and scope of the invention.

What is claimed is:

1. A process for the crucible-free zone pulling of a monocrystalline rod of semiconductor material of the type including the step of supporting a polycrystalline rod of semiconductor material in a generally vertical disposition, together with a seed crystal fixed at its lower end, producing a melting zone in the rod by means of an induction heating coil surrounding the rod, and effecting relative movement between said rod and coil so that the melting zone traverses the entire length of the rod starting from the seed crystal, the improvement comprising the steps of: following the fixation of the seed crystal to the rod, moving a nonmetallic annular support member, made from a material selected from the group consisting of glass or plastic which may be shaped when soft and viscous and then hardened into a solid mass, under the induction coil and towards the rod to a position at which it gently rests against the rod in a softened and viscous state so that the contacting surfaces thereof conform to the contour of the rod in the area of contact, and effecting solidification of said support member so that it forms a firm support for the rod.

2. The process according to claim 1, wherein said support member is made of glass and is moved slowly towards a point of the rod which has a temperature sufficient to soften the type of glass from which it is made.

3. The process according to claim 1, wherein said support member is moved towards the tapered transition region between said seed crystal and said rod.

4. The process according to claim 1 wherein said support member has a hollow cylindrical, tubular, configuration, and the inner diameter of which is smaller than the outer diameter of said rod, but which is larger than the outer diameter of the seed crystal.

5. The process according to claim 4, wherein said support member has a wall thickness which is from 10 to 30% of the outer diameter of said rod.

* * * * *